US012200383B2

(12) United States Patent
Tamaru et al.

(10) Patent No.: US 12,200,383 B2
(45) Date of Patent: Jan. 14, 2025

(54) SOLID-STATE IMAGING APPARATUS AND RANGING APPARATUS

(71) Applicant: Panasonic Intellectual Property Management Co., Ltd., Osaka (JP)

(72) Inventors: Masaki Tamaru, Kyoto (JP); Shigetaka Kasuga, Osaka (JP); Shinzo Koyama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 92 days.

(21) Appl. No.: 18/098,451

(22) Filed: Jan. 18, 2023

(65) Prior Publication Data

US 2023/0156370 A1 May 18, 2023

Related U.S. Application Data

(63) Continuation of application No. PCT/JP2021/025863, filed on Jul. 8, 2021.

(30) Foreign Application Priority Data

Jul. 30, 2020 (JP) ................. 2020-129769

(51) Int. Cl.
*H04N 25/771* (2023.01)
*H04N 25/50* (2023.01)
*H04N 25/78* (2023.01)

(52) U.S. Cl.
CPC ........... *H04N 25/771* (2023.01); *H04N 25/50* (2023.01); *H04N 25/78* (2023.01)

(58) Field of Classification Search
CPC ...... H04N 25/771; H04N 25/50; H04N 25/78; H04N 25/77; H01L 27/146; H01L 31/10; H01L 31/107
See application file for complete search history.

(56) References Cited

U.S. PATENT DOCUMENTS 9,363,453 B2 * 6/2016 Makino ............... H04N 25/621
2009/0153716 A1 6/2009 Ota
(Continued)

FOREIGN PATENT DOCUMENTS

JP 2006-101559 A 4/2006
JP 2008-283615 A 11/2008
(Continued)

OTHER PUBLICATIONS

International Search Report issued on Sep. 28, 2021 in International Patent Application No. PCT/JP2021/025863, with English translation.

*Primary Examiner* — Cynthia Segura
(74) *Attorney, Agent, or Firm* — Rimon P.C.

(57) ABSTRACT

A solid-state imaging apparatus includes a plurality of pixel circuits arranged in a matrix. Each pixel circuit includes: a photodiode; a first charge storage that stores a charge; a floating diffusion region that stores a charge; a second charge storage that stores a charge; a first transfer transistor that transfers a charge from the photodiode to the first charge storage; a second transfer transistor that transfers a charge from the first charge storage to the floating diffusion region; a first reset transistor that resets the floating diffusion region; and an accumulating transistor for accumulating a charge of the floating diffusion region in the second charge storage. The capacitance of the first charge storage is greater than the capacitance of the floating diffusion region, and the capacitance of the second charge storage is greater than the capacitance of the floating diffusion region.

20 Claims, 10 Drawing Sheets

(56) References Cited

U.S. PATENT DOCUMENTS

| | | | |
|---|---|---|---|
| 2015/0155315 A1* | 6/2015 | Toyoguchi | H04N 25/53 |
| | | | 348/308 |
| 2017/0244921 A1* | 8/2017 | Velichko | H04N 25/75 |
| 2018/0288350 A1* | 10/2018 | Dupont | H04N 25/46 |
| 2018/0331133 A1* | 11/2018 | Altice, Jr. | H01L 27/148 |
| 2020/0106982 A1* | 4/2020 | Kasuga | H04N 25/771 |
| 2022/0182572 A1* | 6/2022 | Yamada | G01S 7/4863 |
| 2023/0204415 A1* | 6/2023 | Inoue | H04N 25/70 |
| | | | 250/200 |

FOREIGN PATENT DOCUMENTS

| | | |
|---|---|---|
| JP | 2009-147067 A | 7/2009 |
| WO | 2018/216400 A1 | 11/2018 |

\* cited by examiner

SOLID-STATE IMAGING APPARATUS AND RANGING APPARATUS

CROSS REFERENCE TO RELATED APPLICATIONS

This is a continuation application of PCT International Application No. PCT/JP2021/025863 filed on Jul. 8, 2021, designating the United States of America, which is based on and claims priority of Japanese Patent Application No. 2020-129769 filed on Jul. 30, 2020. The entire disclosures of the above-identified applications, including the specifications, drawings, and claims are incorporated herein by reference in their entirety.

FIELD

The present invention relates to a solid-state imaging apparatus and ranging apparatus.

BACKGROUND

Patent Literature (PTL) 1 discloses a solid-state image sensor that includes pixels including an avalanche photodiode (hereinafter "APD") and detects faint light.

PTL 2 discloses a MOS-type solid-state imaging apparatus including a global shutter function.

PTL 3 discloses a solid-state imaging apparatus including a photoelectric conversion element and a signal output circuit. The photoelectric conversion element includes a pair of electrodes stacked above a semiconductor substrate and a photoelectric conversion layer sandwiched between the pair of electrodes. The signal output circuit outputs a signal corresponding to the charge generated in the photoelectric conversion layer.

CITATION LIST

Patent Literature

PTL 1: WO 2018/216400
PTL 2: Japanese Unexamined Patent Application Publication No.
PTL 3: Japanese Unexamined Patent Application Publication No. 2009-147067

SUMMARY

Technical Problem

Unfortunately, with the conventional techniques, a through-current may flow through the photodiode as a result of the generation of charge, and this through-current may affect the bias voltage of the photodiode, destabilizing its operation.

The present disclosure has an object to provide a solid-state imaging apparatus and a ranging apparatus that inhibit through-current of a photodiode and stabilize its operation.

Solution to Problem

A solid-state imaging apparatus according to one aspect of the present disclosure includes a plurality of pixel circuits arranged in a matrix. Each of the plurality of pixel circuits includes: a photodiode; a first charge storage that stores a charge; a floating diffusion region that stores a charge; a second charge storage that stores a charge; a first transfer transistor that transfers a charge from the photodiode to the first charge storage; a second transfer transistor that transfers a charge from the first charge storage to the floating diffusion region; a first reset transistor that resets the floating diffusion region; and an accumulating transistor for accumulating a charge of the floating diffusion region in the second charge storage. A capacitance of the first charge storage is greater than a capacitance of the floating diffusion region. A capacitance of the second charge storage is greater than the capacitance of the floating diffusion region.

A ranging apparatus according to one aspect of the present disclosure includes the solid-state imaging apparatus described above.

General or specific aspects of the present disclosure may be realized as a system, a method, an integrated circuit, or any given combination of a system, a method, an integrated circuit, a computer program, and a recording medium.

Advantageous Effects

With the solid-state imaging apparatus and the ranging apparatus according to the present disclosure, it is possible to inhibit through-current of the photodiode and stabilize its operation.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS (Underlying Knowledge Forming Basis of Present Invention)

The inventors have discovered that with the solid-state imaging apparatuses disclosed in the Background Art, a through-current can potentially result in unstable operation. This problem will be described using a pixel circuit example as a comparative example.

Figure 9:
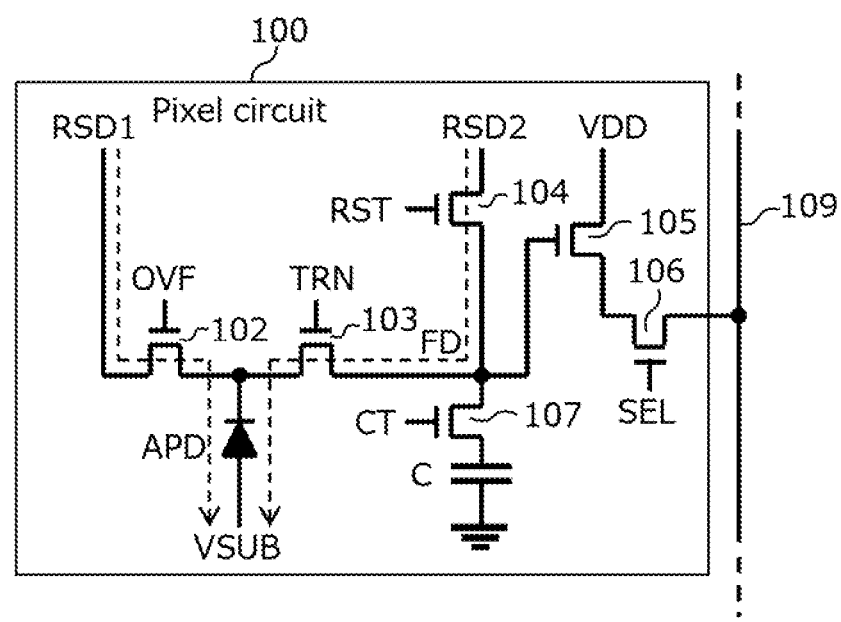
FIG. 9 illustrates a pixel circuit presented as a comparative example where a through-current can occur.
Figure 10:
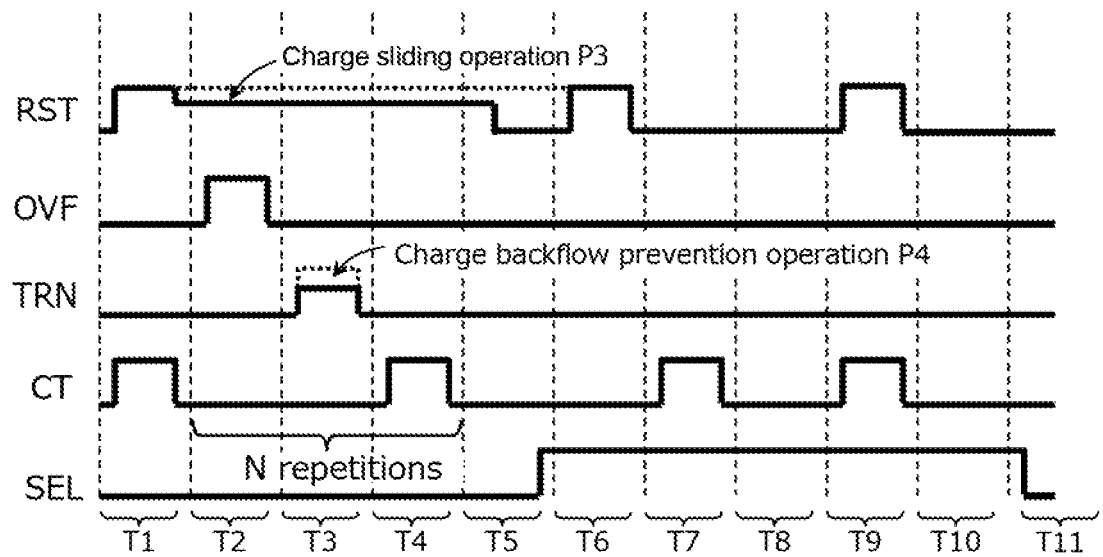
FIG. 10 is a timing chart illustrating an example of the operation of the pixel circuit according to the comparative example in one frame period.

FIG. 9 illustrates pixel circuit 100 presented as a comparative example where a through-current can occur. FIG. 10 is a timing chart illustrating an example of the operation of pixel circuit 100, which is the comparative example, in one frame period.

In FIG. 9, photodiode APD has two modes of operation: a Geiger mode with avalanche multiplication, and a linear mode that generates a charge proportional to the amount of incident light. To operate in Geiger mode, reverse bias voltage VSUB (for example, 25 V) is applied to the anode of photodiode APD.

Reset transistor 102 is a transistor for resetting the charge stored in the cathode of photodiode APD according to reset control signal OVF.

Transfer transistor 103 is a transistor for transferring the charge stored in the cathode of photodiode APD to floating diffusion region FD according to transfer control signal TRN.

Reset transistor 104 is a transistor for resetting the charge stored in floating diffusion region FD according to reset control signal RST.

Amplification transistor 105 is a transistor for converting the amount of charge stored in floating diffusion region FD into voltage.

Selection transistor 106 outputs the voltage converted by amplification transistor 105 to vertical signal line 109 in the period when the selection control signal SEL is active.

Accumulating transistor 107 transfers the charge in floating diffusion region FD to charge storage C by connecting floating diffusion region FD and charge storage C according to accumulating control signal CT.

Charge storage C accumulates the charge transferred a plurality of times from floating diffusion region FD via accumulating transistor 107 as an analog memory.

First, an example of operation in pixel circuit 100, which is the comparative example, configured in this way will be described.

In period T1 in FIG. 10, pixel circuit 100 resets floating diffusion region FD and charge storage C by turning on reset transistor 104 and accumulating transistor 107. Stated differently, floating diffusion region FD and charge storage C are reset to reset voltage RSD2 in order to discharge the charge in floating diffusion region FD and charge storage C.

In period T2, reset transistor 102 resets photodiode APD to reset voltage RSD1 by the high-level reset control signal OVF. Stated differently, the charge of photodiode APD is discharged to the power supply line of reset voltage RSD1. After this, when a photon is incident on photodiode APD gained from exposure, the charge amplified by avalanche multiplication is collected at the cathode of photodiode APD.

In period T3, the charge collected at the cathode of photodiode APD is distributed to floating diffusion region FD via transfer transistor 103.

Thereafter, in period T4, the charge is distributed to charge storage C via accumulating transistor 107.

By repeating the sequence from period T2 to period T4 N times, charge storage C functions as an analog memory that accumulates a charge each time accumulating transistor 107 is turned on. Stated differently, each time a photon is incident on the APD in each sequence, a small amount of charge is accumulated in the analog memory. N mentioned above is an integer of, for example, approximately 100.

From period T6 to period T10, the charge accumulated in charge storage C as analog memory is returned to floating diffusion region FD, further converted to voltage by amplification transistor 105, and output to vertical signal line 109.

More specifically, floating diffusion region FD is reset in period T6. In period T7, charge is transferred from charge storage C to floating diffusion region FD. In period T8, the signal level is output to vertical signal line 109. In period T9, floating diffusion region FD is reset. In period T10, the reset level is output to vertical signal line 109.

In the operation example in FIG. 10, reset transistor 104 is set to a half-on state from period T2 to period T4 described above. In period T3, transfer transistor 103 is set to a half-on state. This is to inhibit excessive charge in photodiode APD due to avalanche multiplication. More specifically, in photodiode APD, avalanche multiplication can generate excess charge above the saturation charge amount. To discharge such excess charge, the potential barrier of reset transistor 102 is set low, and the excess charge is discharged to the power supply line of reset voltage RSD2 via transfer transistor 103 and reset transistor 104.

Even in the configuration described above, where excess charge generated in photodiode APD is directed to the power supply line of reset voltage RSD1, the charge distributed from the cathode of photodiode APD to floating diffusion region FD is not necessarily a certain amount. For example, if the charge is further increased by avalanche multiplication while the charge is distributed from the cathode of photodiode APD to floating diffusion region FD, the amount of charge stored in floating diffusion region FD after distribution may vary. This variation can be a variance (a ranging error), for example, when generating a distance image based on signals from each pixel circuit 100. To reduce this variation in the amount of charge stored in floating diffusion region FD, pixel circuit 100 controls reset transistor 104 and transfer transistor 103 to a half-on state, and discharges, from reset transistor 104 to the power supply line of reset voltage RSD2, charges exceeding a certain level among the charges stored in floating diffusion region FD from the cathode of photodiode APD via the transfer transistor 103. This reduces the variation in the amount of charge stored in the floating diffusion part.

Next, we will discuss the specific problems that can be caused by the through-currents described above.

In the pixel circuit example in FIG. 9, for example, a sudden increase in charge due to avalanche multiplication in photodiode APD can cause a through-current in two paths. One is the path from the power supply line of reset voltage RSD1 to photodiode APD through reset transistor 102 in period T2 in FIG. 10. The other is the path from the power supply line of reset voltage RSD2 to photodiode APD through reset transistor 104 and transfer transistor 103 in period T3.

The problem is that the bias voltage of photodiode APD fluctuates due to the through-current, and the operating characteristics of photodiode APD may be affected. For example, during reset or exposure of photodiode APD, a large amount of charge is generated by avalanche multiplication, and this charge may cause a through-current to flow in the APD. This through-current can cause fluctuations in the bias voltage, resulting in malfunctions such as the operating mode of photodiode APD not being able to change from linear mode to Geiger mode, or the Geiger mode being canceled and the operating mode switching to the linear mode. Such malfunctions cause a loss of sensitivity or S/N degradation of photodiode APD, resulting in a degradation of quality in luminance image or the distance image.

In view of this, the present disclosure provides a solid-state imaging apparatus and a ranging apparatus that inhibit through-current of a photodiode and stabilize its operation.

In order to overcome the above-described problem, a solid-state imaging apparatus according to one aspect of the present disclosure includes a plurality of pixel circuits arranged in a matrix. Each of the plurality of pixel circuits includes: a photodiode; a first charge storage that stores a charge; a floating diffusion region that stores a charge; a second charge storage that stores a charge; a first transfer transistor that transfers a charge from the photodiode to the first charge storage; a second transfer transistor that transfers a charge from the first charge storage to the floating diffusion region; a first reset transistor that resets the floating diffusion region; and an accumulating transistor for accumulating a charge of the floating diffusion region in the second charge storage. A capacitance of the first charge storage is greater than a capacitance of the floating diffusion region. A capacitance of the second charge storage is greater than the capacitance of the floating diffusion region.

This configuration makes it possible to inhibit through-current of the photodiode and stabilize its operation. In other words, the above configuration makes formation of a through-current path difficult. More specifically, the first transfer transistor and the second transfer transistor are interposed in series between the first reset transistor and photodiode APD, making it difficult to form a through-current path. For example, even if the first reset transistor is half-on and the charge surges due to avalanche multiplication, formation of a through-current path is difficult.

A ranging apparatus according to one aspect of the present disclosure includes the solid-state imaging apparatus described above.

General or specific aspects of the present disclosure may be realized as a system, a method, an integrated circuit, or any given combination thereof.

Hereinafter, embodiments will be described in detail with reference to the drawings.

Each of the following embodiments describes a general or specific example. The numerical values, shapes, materials, elements, the arrangement and connection of the elements, the order of the operations etc., shown in the following embodiments are mere examples, and therefore do not limit the scope of the present disclosure.

Embodiment 1

[1.1 Pixel Circuit Configuration]

Figure 1:
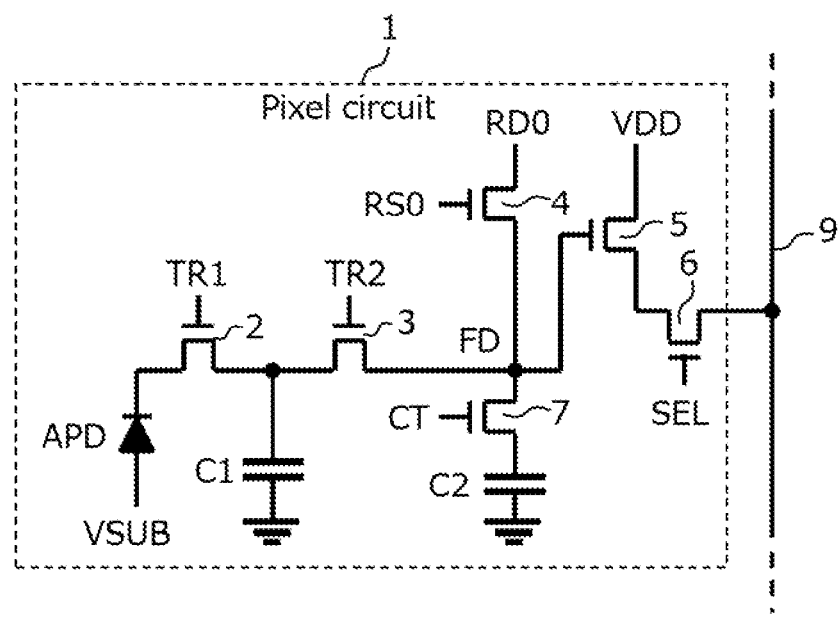
FIG. 1 illustrates one example of a pixel circuit according to Embodiment 1.

FIG. 1 illustrates one example of pixel circuit 1 according to Embodiment 1.

Pixel circuit 1 includes photodiode APD, first charge storage C1, floating diffusion region FD, second charge storage C2, first transfer transistor 2, second transfer transistor 3, first reset transistor 4, amplification transistor 5, selection transistor 6, and accumulating transistor 7. FIG. 1 also illustrates vertical signal line 9, which is provided per column of a plurality of pixel circuits 1 arranged in a matrix.

Photodiode APD is an avalanche photodiode that amplifies the electrons (charge) generated by incident photons to the saturation charge amount by avalanche multiplication. Photodiode APD has two modes of operation: a Geiger mode with avalanche multiplication, and a linear mode that generates a charge proportional to the amount of incident light. To operate in Geiger mode, reverse bias voltage VSUB (for example, 25 V), which is greater than in linear mode, is applied to photodiode APD.

First charge storage C1 stores the charge transferred from photodiode APD via first transfer transistor 2. One of the two electrodes of first charge storage C1 is connected to the ground line. The other of the two electrodes of first charge storage C1 is connected to the drain or the source of first transfer transistor 2 and to the drain or the source of second transfer transistor 3. The capacitance of first charge storage C1 may be larger than the capacitance of floating diffusion region FD. Although one of the two electrodes of first charge storage C1 is exemplified as connected to the ground line, it may be connected to a line with a potential different from that of the ground line.

Floating diffusion region FD stores the charge transferred from first charge storage C1 via second transfer transistor 3.

Second charge storage C2 accumulates the charge transferred from floating diffusion region FD via accumulating transistor 7. As used herein, the term "accumulate" means not only holding the charge from a single transfer of accumulating transistor 7, but also accumulating the charge from a plurality of transfers as an analog memory. One of the two electrodes of second charge storage C2 is connected to the ground line. The other of the two electrodes of second charge storage C2 is connected to the drain or the source of second transfer transistor 3 and to floating diffusion region FD. Although one of the two electrodes of second charge storage C2 is exemplified as connected to the ground line, it may be connected to a line with a potential different from that of the ground line. The capacitance of second charge storage C2 may be larger than the capacitance of floating diffusion region FD. As one example of capacitance, photodiode APD may be 1.5 fF, first charge storage C1 may be 20 fF, second charge storage C2 may be 20 fF, and floating diffusion region FD may be 2 fF.

First transfer transistor 2 transfers charge from photodiode APD to first charge storage C1 according to transfer control signal TR1. More specifically, transfer control signal TR1 is input to the gate of first transfer transistor 2. One of the drain and the source of first transfer transistor 2 is connected to the cathode of photodiode APD. The other of the drain and the source of first transfer transistor 2 is connected to first charge storage C1. For example, first transfer transistor 2 is on when transfer control signal TR1 is high-level and off when transfer control signal TR1 is low-level. The charge transfer by first transfer transistor 2 may be, for example, a partial transfer by capacitance distribution between photodiode APD and first charge storage C1, or a complete transfer from photodiode APD to the first charge storage.

Second transfer transistor 3 transfers charge from first charge storage C1 to floating diffusion region FD according to transfer control signal TR2. More specifically, transfer control signal TR2 is input to the gate of second transfer transistor 3. One of the drain and the source of second transfer transistor 3 is connected to first charge storage C1. The other of the drain and the source of second transfer transistor 3 is connected to floating diffusion region FD. Transfer control signal TR2 is a ternary signal, not a binary signal. Stated differently, transfer control signal TR2 is a signal that can assume three states, i.e., high-level, low-level, and an additional half-level. For example, second transfer transistor 3 is on when transfer control signal TR2 is high-level, off when transfer control signal TR2 is low-level, and half-on when transfer control signal TR2 is half-level. Here, the half-on state refers to a state in which second transfer transistor 3 is incompletely on and a potential barrier is formed under the gate of second transfer transistor 3. Due to this potential barrier, the portion of the charge in first charge storage C1 that exceeds a certain amount is transferred from second transfer transistor 3 to floating diffusion region FD, and the portion of the charge in first charge storage C1 that is within the certain amount remains in first charge storage C1.

First reset transistor 4 resets floating diffusion region FD according to reset control signal RS0, i.e., resets the potential of floating diffusion region FD to reset voltage RD0. In addition to the reset function, first reset transistor 4 has the function of limiting the charge stored in floating diffusion region FD to a predetermined amount or less. This function is called the charge sliding function or charge sliding operation. Accordingly, reset control signal RS0 is a ternary signal, not a binary signal. Stated differently, transfer control signal TR2 is a signal that can assume three states, i.e., high-level, low-level, and an additional half-level. For example, first reset transistor 4 is on when transfer reset control signal RS0 is high-level, off when reset control signal RS0 is low-level, and half-on when reset control signal RS0 is half-level. Here, the half-on state refers to a state in which first reset transistor 4 is incompletely on and a potential barrier is formed in first reset transistor 4, and fulfills the sliding function described above. Due to this potential barrier, the portion of the charge in floating diffusion region FD that exceeds a predetermined amount is discharged to the drain of reset voltage RD0 via first reset transistor 4. As a result, during the sliding operation, the charge in floating diffusion region FD is inhibited so that it does not exceed a predetermined amount.

Amplification transistor 5, together with a current source connected to vertical signal line 9, constitutes a source follower circuit. More specifically, when selection transistor 6 is off, amplification transistor 5 does not operate, but when selection transistor 6 is on, amplification transistor 5 and the above current source are connected to form a source follower circuit. In other words, amplification transistor 5 converts the charge in floating diffusion region FD to a voltage when selection transistor 6 is on, and outputs it as a pixel signal to vertical signal line 9.

Selection transistor 6 connects amplification transistor 5 and vertical signal line 9 according to selection control signal SEL. Selection control signal SEL is a signal provided per row of the plurality of pixel circuits 1 arranged in a matrix.

Accumulating transistor 7 transfers the charge in floating diffusion region FD to second charge storage C2 by connecting floating diffusion region FD and second charge storage C2 according to accumulating control signal CT.

FIG. 1 illustrates an example in which each of first transfer transistor 2, second transfer transistor 3, first reset transistor 4, amplification transistor 5, selection transistor 6, and accumulating transistor 7 is implemented as an NMOS transistor, but each may be implemented as PMOS transistor.

Although FIG. 1 illustrates an example of a pixel circuit in which photodiode APD is an avalanche photodiode, photodiode APD is not limited to this example. In other words, the present disclosure is useful even for pixel circuits that use common photodiodes that generate an amount of charge corresponding to the amount of light received.

[1.2 Configuration of Solid-State Imaging Apparatus]

Next, an example of a configuration of a solid-state imaging apparatus including pixel circuit 1 will be described.

Figure 2:
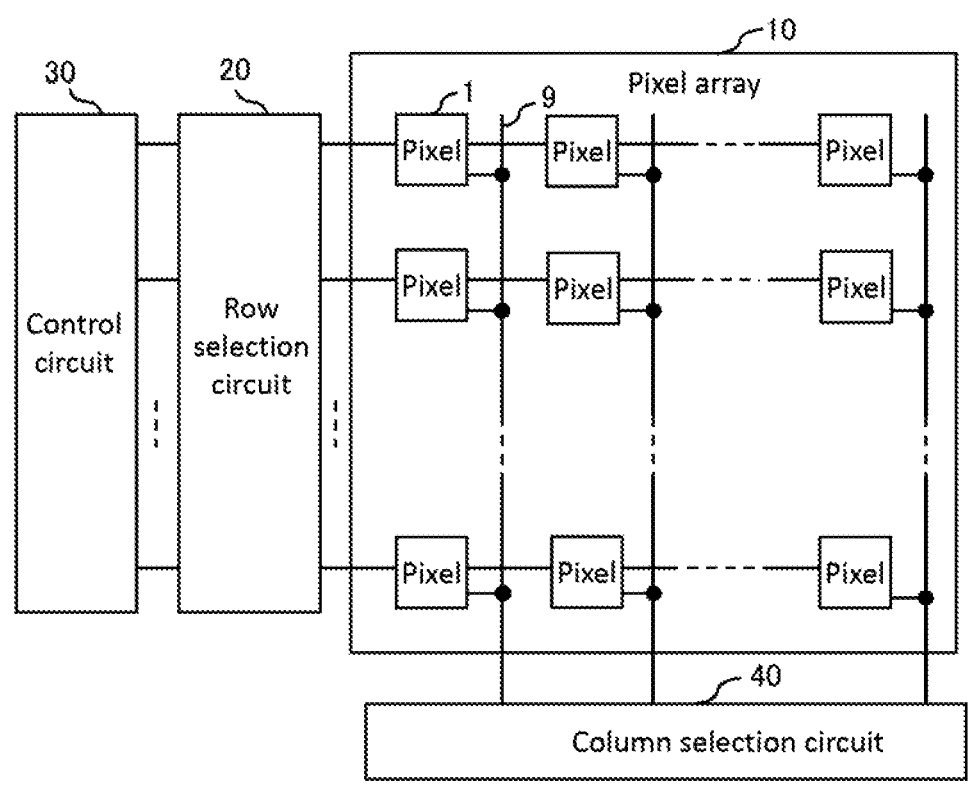
FIG. 2 is a diagram illustrating an example of a configuration of a solid-state imaging apparatus according to Embodiment 1.

FIG. 2 is a diagram illustrating an example of a configuration of a solid-state imaging apparatus according to Embodiment 1. The solid-state imaging apparatus illustrated in FIG. 2 includes pixel array 10, row selection circuit 20, control circuit 30, and column selection circuit 40.

Pixel array 10 includes a plurality of pixel circuits 1 arranged in a matrix. Pixel circuit 1 may be the same as in FIG. 1.

Row selection circuit 20 outputs, to each row of pixel circuits 1, selection control signal SEL for reading out pixel signals. Pixel signal readout can be a rolling operation performed row by row.

Control circuit 30 generates transfer control signal TR1, transfer control signal TR2, reset control signal RS0, and accumulating control signal CT to control the exposure operation of pixel circuit 1. The exposure operation is a global operation in which all pixel circuits 1 are exposed simultaneously.

Column selection circuit 40 receives the pixel signals row by row and sequentially selects and outputs the pixel signals. For example, the pixel signal includes two types of signals, a reset level and a signal level, and column selection circuit 40 includes a correlated double sampling (CDS) circuit per column, and outputs the pixel signal after CDS. The CDS circuit may process pixel signals either by analog or digital processing.

[1.3 Operation]

Next, the operation of pixel circuit 1 and the solid-state imaging apparatus according to Embodiment 1, which are configured as described above, will be described.

Figure 3:
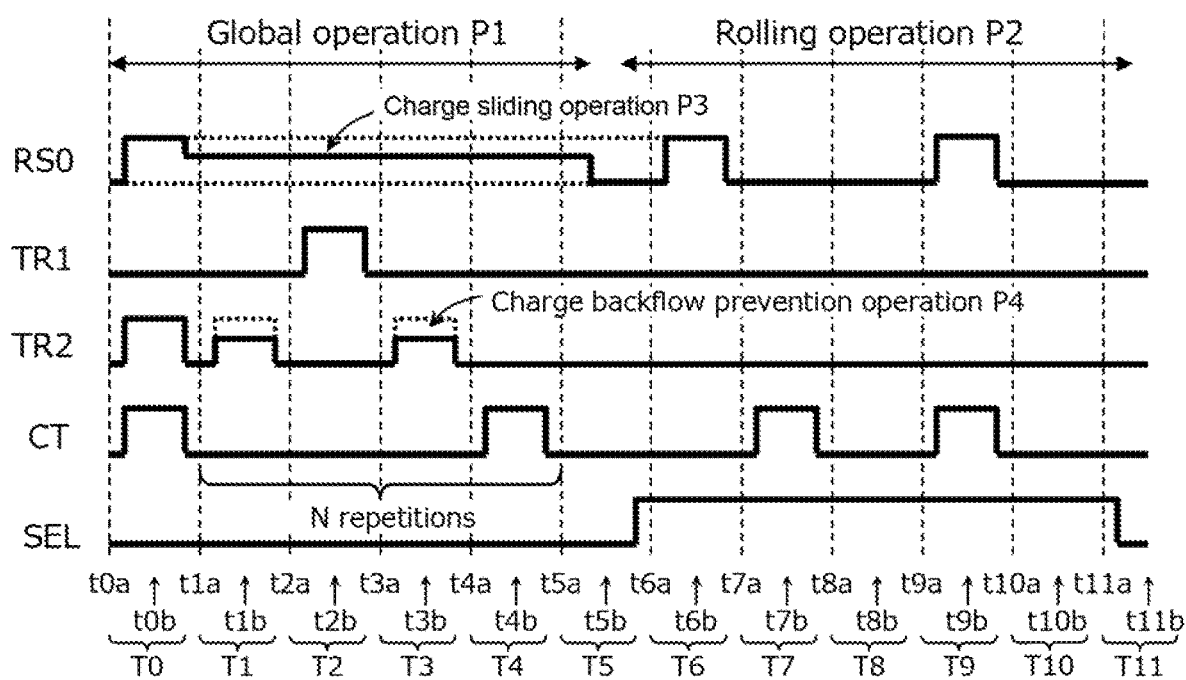
FIG. 3 illustrates a timing chart of a drive example of the pixel circuit according to Embodiment 1.
Figure 4:
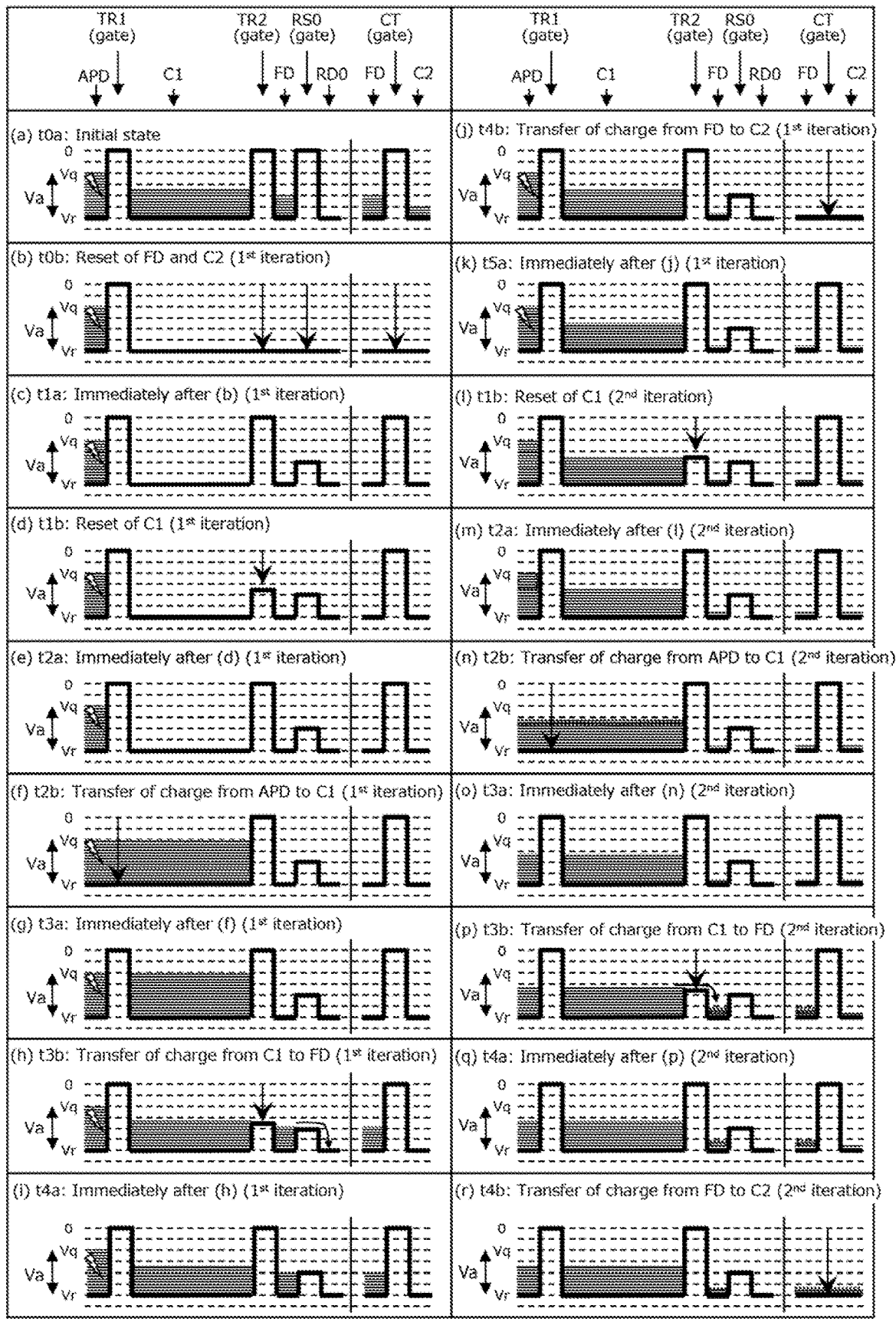
FIG. 4 is a diagram explaining operations and illustrating the potential and charge of each part of the pixel circuit according to Embodiment 1.

FIG. 3 illustrates a timing chart of a drive example of pixel circuit 1 according to Embodiment 1. Time is represented on the horizontal axis in FIG. 3. The vertical axis corresponds to reset control signal RS0, transfer control signal TR1, transfer control signal TR2, accumulating control signal CT, and selection control signal SEL. Period T0 to period T4 in FIG. 3 corresponds to global operation P1 that simultaneously exposes all pixel circuits 1. Period T5 to period T10 corresponds to rolling operation P2 that reads out pixel circuits 1 row by row. FIG. 4 is a diagram explaining operations and illustrating the potential and charge of each part of pixel circuit 1 according to Embodiment 1. In FIG. 4, (a) through (r) schematically illustrate the potentials and charges at the corresponding times from time t0a to time t11b in FIG. 3. In the example in FIG. 4, "TR1 (gate)" indicates the potential of transfer control signal TR1, i.e., the potential under the gate of first transfer transistor 2, "TR2 (gate)" indicates the potential of transfer control signal TR2, i.e., the potential under the gate of second transfer transistor 3, "RS0 (gate)" indicates the potential of reset control signal RS0, i.e., the potential under the gate of first reset transistor 4, and "CT (gate)" indicates the potential of accumulating control signal CT, i.e., the potential under the gate of accumulating transistor 7. Note that potential increases downward in FIG. 4.

Each hatched area in FIG. 4 schematically illustrates the charge stored in the valley of the potential barrier. The range from Vq to Vr of cathode voltage Va of photodiode APD indicates the avalanche operating range, i.e., the Geiger mode.

Period T1 to period T4 in FIG. 3 shows N repetition operations for accumulating charge in second charge storage C2. For example, N may be 100. In FIG. 4, (a) through (k) show the first iteration of the repetition operations, and assume continuous exposure and the presence of incident light.

Time t0a in (a) in FIG. 4, i.e., the beginning of period T0 in FIG. 3, corresponds to the initial state. In the initial state, "TR1 (gate)", "TR2 (gate)", "RS0 (gate)", and "CT (gate)" are all low-level. In other words, first transfer transistor 2, second transfer transistor 3, first reset transistor 4, and accumulating transistor 7 are all off. Stated differently, pixel circuit 1 is in the initial state.

Time t0b in (b) in FIG. 4, i.e., the middle part of period T0 in FIG. 3, corresponds to the reset operation of floating diffusion region FD and second charge storage C2 in the first iteration of the repetition operations. In the reset operation, "TR1 (gate)" is low-level, and "TR2 (gate)", "RS0 (gate)", and "CT (gate)" are high-level. In FIG. 4, high-level is Vr. As a result, first transfer transistor 2 is off, and second transfer transistor 3, first reset transistor 4, and accumulating transistor 7 are all on. In other words, compared to (a) in FIG. 4, in (b) in FIG. 4, second transfer transistor 3, first reset transistor 4, and accumulating transistor 7 are changed from off to on. This resets floating diffusion region FD and second charge storage C2 to reset voltage RD0. At this time, first charge storage C1 is also reset to reset voltage RD0. In FIG. 4, reset voltage RD0 is Vr. Thus, since the reset operation in (b) in FIG. 4 does not create a path for a through-current to flow through photodiode APD, fluctuations in the bias voltage of photodiode APD are inhibited, which allows for stable operation.

Time t1a in (c) in FIG. 4, i.e., the beginning of period T1 in FIG. 3, corresponds to the state immediately after the reset of floating diffusion region FD and second charge storage C2 in the first iteration of the repetition operations. In this state, first transfer transistor 2, second transfer transistor 3, and accumulating transistor 7 are off. First reset transistor 4 is not off but half-on. First reset transistor 4 is maintained in the half-on state from period T2 to period T4 thereafter. This causes first reset transistor 4 to perform charge sliding operation P3. In other words, charge exceeding a predetermined amount in floating diffusion region FD is discharged to the power supply line of reset voltage RD0 via first reset transistor 4. Stated differently, the charge stored in floating diffusion region FD is inhibited so that it does not exceed a predetermined amount.

Time t1b in (d) in FIG. 4, i.e., the middle part of period T1 in FIG. 3, corresponds to an operation to reset first charge storage C1 in the first iteration of the repetition operations. In this reset operation, first transfer transistor 2 and accumulating transistor 7 are off, and second transfer transistor 3 and first reset transistor 4 are half-on. In other words, compared to (c) in FIG. 4, in (d) in FIG. 4, second transfer transistor 3 changes from off to half-on. As illustrated in (d) in FIG. 4, in the first iteration of the repetition operations, since first charge storage C1 is maintained in the reset state in (b) in FIG. 4, the reset operation is meaningless, but the reset operation in the second and subsequent iterations is meaningful. In this reset operation, instead of setting the potential of first charge storage C1 directly, second transfer transistor 3 is turned half-on to reset first charge storage C1 to a state where a certain amount of charge is stored in first charge storage C1. This certain amount is set by the height of the potential barrier under the gate of second transfer transistor 3, i.e., by the half-level potential of transfer control signal TR2. In (d) in FIG. 4, the half-level potential of transfer control signal TR2 is set lower than the half-level potential of reset control signal RS0. Stated differently, the half-level potential barrier of transfer control signal TR2 is set higher than the half-level potential barrier of reset control signal RS0. In the example in FIG. 4, the half-level potential of transfer control signal TR2 is approximately Vr/2, which is lower than the half-level potential of reset control signal RS0. Stated differently, the potential barrier of second transfer transistor 3 is set higher than the potential barrier of first reset transistor 4. The potential barrier of second transfer transistor 3 is set higher than the potential barrier of first reset transistor 4 in order to realize charge backflow prevention operation P4, which prevents the backflow of charge from floating diffusion region FD to first charge storage C1. This effect is not exhibited in the first iteration of the repetition operations, but is exhibited in the second and subsequent iterations. Thus, since the reset operation in (d) in FIG. 4 does not create a path for a through-current to flow through photodiode APD, fluctuations in the bias voltage of photodiode APD are inhibited, which allows for stable operation.

Time t2a in (e) in FIG. 4, i.e., the beginning of period T2 in FIG. 3, corresponds to the state immediately after the reset operation of first charge storage C1 in the first iteration of the repetition operations. In this state, first transfer transistor 2, second transfer transistor 3, and accumulating transistor 7 are off, and first reset transistor 4 is half-on. The charge in first charge storage C1 is cleared in the first iteration of the reset operation of first charge storage C1, but is reset so that the amount of charge does not exceed a certain amount in the second and subsequent reset operations.

Time t2b in (f) in FIG. 4, i.e., the middle part of period T2 in FIG. 3, corresponds to the transfer of charge from photodiode APD to first charge storage C1 in the first iteration of the repetition operations. In this charge transfer, first transfer transistor 2 is on, second transfer transistor 3 and accumulating transistor 7 are off, and first reset transistor 4 is half-on. In other words, compared to (e) in FIG. 4, in (f) in FIG. 4, first transfer transistor 2 changes from off to on. As a result of first transfer transistor 2 being on, the potential barrier between photodiode APD and first charge storage C1 is eliminated and the charge of photodiode APD is transferred to first charge storage C1, bringing them to the same potential.

Put more specifically, in this operation example, since light is constantly incident on photodiode APD, photodiode APD receives incident light and generates a large amount of charge due to avalanche multiplication. Avalanche multiplication stops when photodiode APD reaches the Vq potential at which it is quenched. As a result, photodiode APD and first charge storage C1 are filled with charge up to the Vq potential, as illustrated in (f) in FIG. 4.

Here, in the period when first transfer transistor 2 is on, since second transfer transistor 3 is off, no current path is formed in photodiode APD where a through-current can occur. Through-current caused by avalanche multiplication can therefore be inhibited and the operation of photodiode APD can be stabilized.

Time t3a in (g) in FIG. 4, i.e., the beginning of period T3 in FIG. 3, corresponds to the state immediately after the transfer of charge from photodiode APD to first charge storage C1 in the first iteration of the repetition operations. In this state, first transfer transistor 2, second transfer transistor 3, and accumulating transistor 7 are off, and first reset transistor 4 is half-on. A charge up to the Vq potential is stored in photodiode APD. A charge is also stored up to the Vq potential in first charge storage C1.

Time t3b in (h) in FIG. 4, i.e., the middle part of period T3 in FIG. 3, corresponds to the transfer of charge from first charge storage C1 to floating diffusion region FD in the first iteration of the repetition operations. In this charge transfer, first transfer transistor 2 and accumulating transistor 7 are off, and second transfer transistor 3 and first reset transistor 4 are half-on. In other words, compared to (g) in FIG. 4, in (h) in FIG. 4, second transfer transistor 3 changes from off to half-on. Since second transfer transistor 3 is half-on, the portion of the charge that was stored in first charge storage C1 in (g) in FIG. 4 that exceeds a certain amount is transferred to floating diffusion region FD. The potential barrier caused by the half-on state of second transfer transistor 3 is set slightly higher than the potential barrier caused by the half-on state of first reset transistor 4, just as in (d) in FIG. 4. Moreover, since first reset transistor 4 is also half-on, the portion of the charge transferred from first charge storage C1 that exceeds a predetermined amount is discharged to the power supply line of reset voltage RD0 as a result of the sliding operation. In other words, the charge stored in floating diffusion region FD is inhibited so that it does not exceed a predetermined amount.

Time t4a in (i) in FIG. 4, i.e., the beginning of period T4 in FIG. 3, corresponds to the state immediately after the transfer of charge from first charge storage C1 to floating diffusion region FD in the first iteration of the repetition operations. In this state, first transfer transistor 2, second transfer transistor 3, and accumulating transistor 7 are off, and first reset transistor 4 is half-on. In other words, compared to (h) in FIG. 4, in (i) in FIG. 4, second transfer transistor 3 changes from half-on to off. In this state, floating diffusion region FD stores the charge transferred from first charge storage C1. A charge not exceeding a certain amount is stored in first charge storage C1 as well.

Time t4b in (j) in FIG. 4, i.e., the middle part of period T4 in FIG. 3, corresponds to the transfer of charge from floating diffusion region FD to second charge storage C2 in the first iteration of the repetition operations. In this charge transfer, first transfer transistor 2 and second transfer transistor 3 are off, first reset transistor 4 is half-on, and accumulating transistor 7 is on. In other words, compared to (i) in FIG. 4, in (j) in FIG. 4, accumulating transistor 7 changes from off to on. As a result, floating diffusion region FD and second charge storage C2 have the same potential, and the charge is capacitively distributed. In other words, part of the charge stored in floating diffusion region FD is transferred to second charge storage C2.

Time t5a in (k) in FIG. 4, i.e., the beginning of period T5 in FIG. 3, corresponds to the state immediately after the transfer of charge from floating diffusion region FD to second charge storage C2 in the first iteration of the repetition operations. In this state, first transfer transistor 2, second transfer transistor 3, and accumulating transistor 7 are off, and first reset transistor 4 is half-on. In other words, compared to (j) in FIG. 4, in (k) in FIG. 4, accumulating transistor 7 changes from on to off. In this state, second charge storage C2 stores the charge transferred from floating diffusion region FD.

In FIG. 4, (a) to (k) illustrate the first iteration of N repetition operations in global operation P1.

The same operation as the first iteration is repeated thereafter. Repeating operation from periods T1 to T4 N times accumulates the pixel signals from N exposures in second charge storage C2. This improves the signal-to-noise ratio and accuracy of pixel signals.

After global operation P1, which includes N repetitions of periods T1 to T4, rolling operation P2 is performed to read out pixel signals row by row.

Period T5 in FIG. 3 is the transition period from global operation P1 to rolling operation P2. Rolling operation P2 includes periods T6 through T11.

In period T6, floating diffusion region FD is reset. However, the reset of floating diffusion region FD may be omitted in period T6.

In period T7, charge is accumulated in second charge storage C2 and transferred to FD.

In period T8, the charge in floating diffusion region FD is converted to voltage by amplification transistor 5. The converted voltage is output to vertical signal line 9 as a signal level among pixel signals.

In period T9, floating diffusion region FD and second charge storage C2 are reset to reset voltage RD0.

In period T10, the charge in the reset floating diffusion region FD is converted to voltage by amplification transistor 5. The converted voltage is output to vertical signal line 9 as a reset level among pixel signals.

Period T11 is the transition period to the next frame period.

As described above, the solid-state imaging apparatus according to Embodiment 1 includes a plurality of pixel circuits 1 arranged in a matrix. Each of the plurality of pixel circuits 1 includes: photodiode APD; first charge storage C1 that stores a charge; floating diffusion region FD that stores a charge; second charge storage C2 that stores a charge; first transfer transistor 2 that transfers a charge from photodiode APD to first charge storage C1; second transfer transistor 3 that transfers a charge from first charge storage C1 to floating diffusion region FD; first reset transistor 4 that resets floating diffusion region FD; and accumulating transistor 7 for accumulating a charge of floating diffusion region FD in second charge storage C2. The capacitance of first charge storage C1 is greater than the capacitance of floating diffusion region FD. The capacitance of second charge storage C2 is greater than the capacitance of floating diffusion region FD.

This makes it possible to inhibit through-current of the photodiode and stabilize its operation. In other words, the above configuration makes formation of a through-current path difficult. More specifically, the first transfer transistor and the second transfer transistor are interposed in series between the first reset transistor and photodiode APD, making it difficult to form a through-current path.

Furthermore, in the comparative example in FIG. 9, the charge discharged from the power supply lines of reset voltage RSD1 and reset voltage RSD2 may flow into adjacent pixels creating noise and leading to performance defects such as white-out in adjacent pixels. The solid-state imaging apparatus according to Embodiment 1 has the advantageous effect of improving this problem.

The solid-state imaging apparatus may further include control circuit 30 that resets first charge storage C1 by turning off first transfer transistor 2 and accumulating transistor 7 and turning half-on first reset transistor 4 and second transfer transistor 3.

This makes it possible to inhibit through-current of the photodiode and stabilize its operation since formation of a through-current path is difficult. For example, even when the first reset transistor is half-on, it is possible to inhibit through-current of the photodiode and stabilize its operation.

The solid-state imaging apparatus may further include control circuit 30 that: turns off first transfer transistor 2 and turns on first reset transistor 4, second transfer transistor 3, and accumulating transistor 7 in a first period for resetting floating diffusion region FD and second charge storage C2; and turns off first transfer transistor 2 and accumulating transistor 7 and turns half-on first reset transistor 4 and second transfer transistor 3 in a second period for resetting first charge storage C1. Note that the first period corresponds to period T0 in FIG. 3, and the second period corresponds to period T1 in FIG. 3.

This makes it possible to inhibit through-current of the photodiode and stabilize its operation since formation of a through-current path is difficult, even when first reset transistor 4 and second transfer transistor 3 are half-on.

In one frame period, control circuit 30 may control global operation P1 and rolling operation P2. Global operation P1 includes simultaneously exposing the plurality of pixel circuits 1. Rolling operation P2 includes reading out signals row by row from the plurality of pixel circuits 1. The first period and the second period may be included in global operation P1. Control circuit 30 may maintain first reset transistor 4 in a half-on state in the second period and subsequent periods of global operation P1.

With this, even if a charge is suddenly generated by avalanche multiplication in global operation P1, the excess charge can be properly controlled because first reset transistor 4 discharges a charge exceeding a certain amount in floating diffusion region FD.

The solid-state imaging apparatus may further include control circuit 30 that turns half-on first reset transistor 4.

With this, the excess charge can be properly controlled because first reset transistor 4 discharges the portion of the charge in floating diffusion region FD that exceeds a certain amount.

The solid-state imaging apparatus may further include control circuit 30 that turns half-on second transfer transistor 3.

With this, the portion of the charge in first charge storage C1 that exceeds a certain amount can be transferred to floating diffusion region FD.

Control circuit 30 may: control transfer of charge from photodiode APD to first charge storage C1 in a third period; control transfer of charge from first charge storage C1 to floating diffusion region FD in a fourth period; control storage of charge from floating diffusion region FD to second charge storage C2 in a fifth period; and maintain first reset transistor 4 in a half-on state from the second period to the fifth period. Note that the third through fifth periods correspond to periods T2 through T4 in FIG. 3.

With this, even if a charge is suddenly generated by avalanche multiplication from the second period to the fourth period, the amount of charge can be properly controlled because first reset transistor 4 discharges a charge greater than or equal to a certain amount.

In fourth period T3, control circuit 30 may turn off first transfer transistor 2 and accumulating transistor 7 and turn half-on second transfer transistor 3.

In the fourth period, the height of a potential barrier formed at a gate of second transfer transistor 3 may be greater than the height of a potential barrier formed at a gate of first reset transistor 4.

This can inhibit charge backflow in the transfer of charge from first charge storage C1 to floating diffusion region FD.

In one frame period, control circuit 30 may repeat the second period through the fifth period a plurality of times after the first period.

This significantly increases the amount of signal gained from exposure, thus improving the signal-to-noise ratio of the pixel signal and the accuracy of the pixel signal.

A ranging apparatus according to one aspect of Embodiment 1 includes the solid-state imaging apparatus described above.

This makes it possible to inhibit through-current of the photodiode and stabilize its operation. In other words, the above configuration makes formation of a through-current path difficult. More specifically, the first transfer transistor and the second transfer transistor are interposed in series between the first reset transistor and photodiode APD, making it difficult to form a through-current path.

Embodiment 2

In Embodiment 1, an example of resetting the charge to a certain amount by turning second transfer transistor 3 half-on in the reset operation of first charge storage C1 was given. In contrast, Embodiment 2 describes a configuration example in which first charge storage C1 is directly reset to a predetermined reset potential without second transfer transistor 3.

The solid-state imaging apparatus according to Embodiment 2 may have the configuration illustrated in FIG. 2.

[2.1 Pixel Circuit Configuration]

Figure 5:
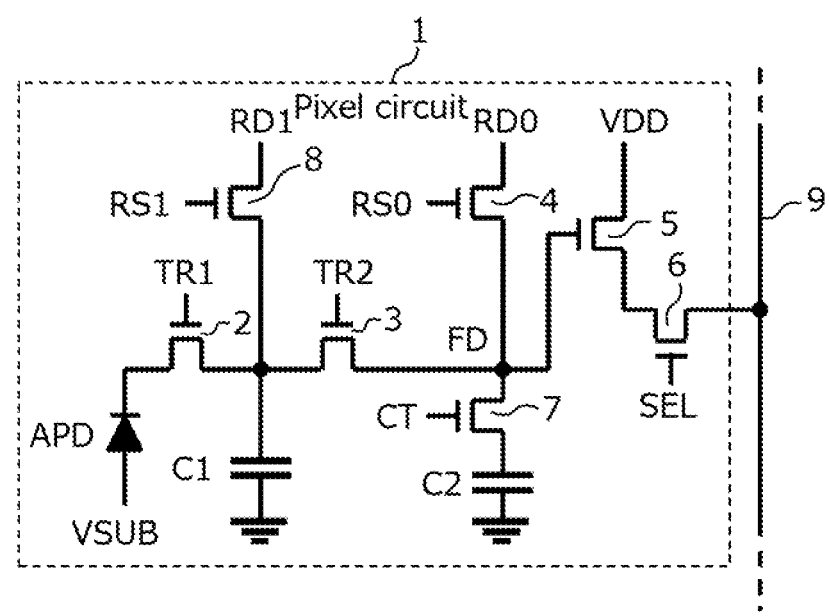
FIG. 5 illustrates a circuit example of a pixel circuit according to Embodiment 2.

FIG. 5 illustrates a circuit example of pixel circuit 1 according to Embodiment 2. FIG. 5 differs from FIG. 1 in that second reset transistor 8 is added. The following description will avoid duplicate explanations and focus on points of difference with Embodiment 1.

Second reset transistor 8 resets first charge storage C1 according to reset control signal RS1, i.e., resets the potential of first charge storage C1 to reset voltage RD1. The drain of second reset transistor 8 is connected to the power supply line of reset voltage RD1. The gate of second reset transistor 8 receives an input of reset control signal RS1. The source of second reset transistor 8 is connected to first charge storage C1, one of the source and the drain of first transfer transistor 2, and one of the source and the drain of second transfer transistor 3.

Reset control signal RS1 is a binary signal that takes high- and low-levels. Hence, second reset transistor 8 takes on two states, on and off.

[2.2 Operation]

Next, the operation of pixel circuit 1 according to Embodiment 2, which is configured as described above, will be described.

Figure 6:
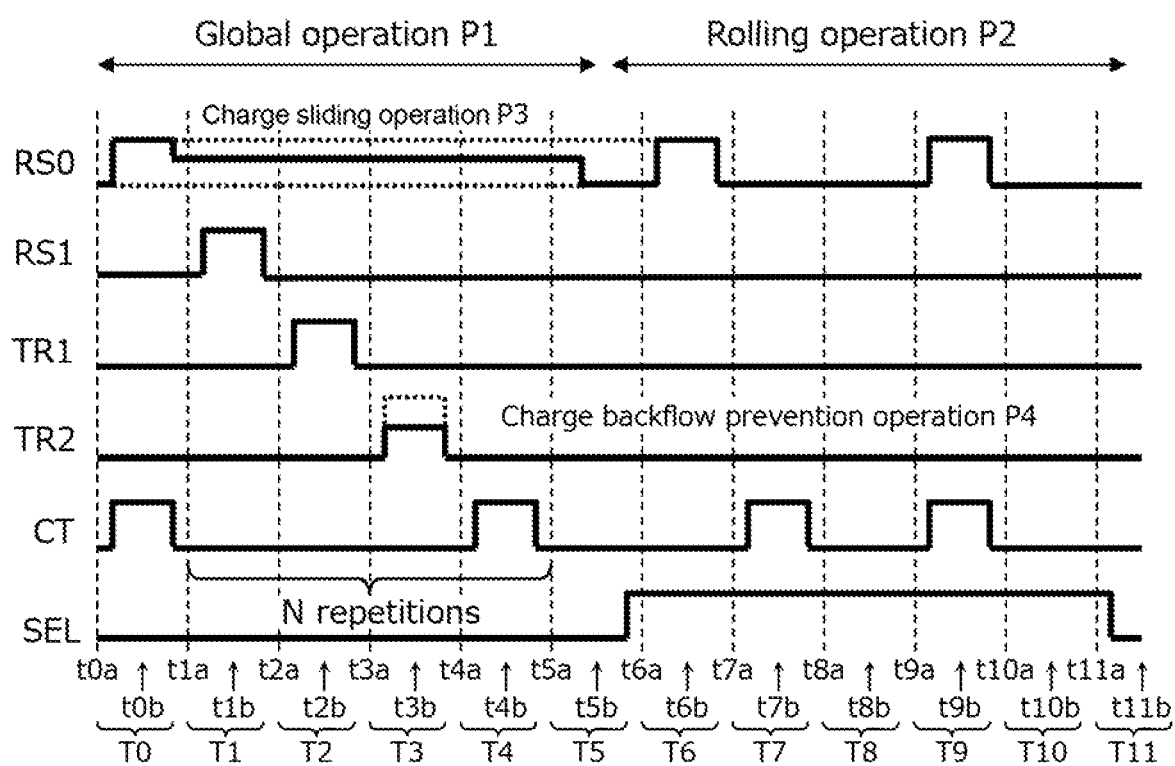
FIG. 6 illustrates a timing chart of a drive example of the pixel circuit according to Embodiment 2.
Figure 7:
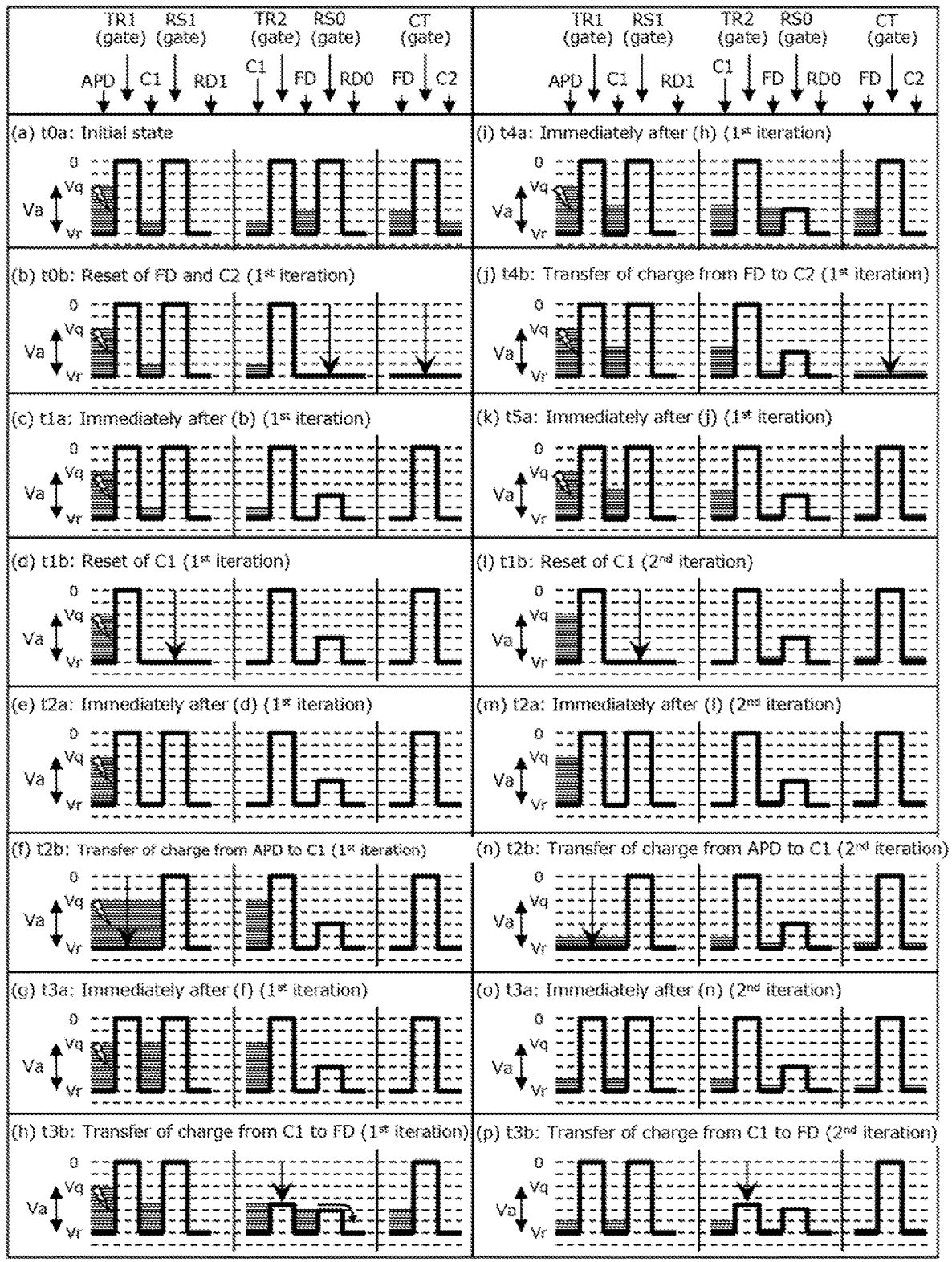
FIG. 7 is a diagram explaining operations and illustrating an example of the potential of each part of the pixel circuit according to Embodiment 2.

FIG. 6 illustrates a timing chart of a drive example of pixel circuit 1 according to Embodiment 2. FIG. 6 differs from FIG. 3 mainly in the addition of reset control signal RS1 and the respective signal waveforms of transfer control signal TR1 and transfer control signal TR2. FIG. 7 is a diagram explaining operations and illustrating the potential and charge of each part of pixel circuit 1 according to Embodiment 2. FIG. 7 differs from FIG. 4 mainly in the addition of "RS1 (gate)" and the potential of each phase. The following description will focus on this difference.

In FIG. 7, "RS1 (gate)" indicates the potential of reset control signal RS1 input to the gate of second reset transistor 8, i.e., the potential under the gate of second reset transistor 8. In FIG. 7, (a) through (k) show the first iteration of the repetition operations, and assume continuous exposure and the presence of incident light.

Time t0a in (a) in FIG. 7, i.e., the beginning of period T0 in FIG. 6, corresponds to the initial state. In the initial state, "TR1 (gate)", "RS1 (gate)", "TR2 (gate)", "RS0 (gate)", and "CT (gate)" are all low-level. In other words, first transfer transistor 2, second reset transistor 8, second transfer transistor 3, first reset transistor 4, and accumulating transistor 7 are all off. Stated differently, pixel circuit 1 is in the initial state.

Time t0b in (b) in FIG. 7, i.e., the middle part of period T0 in FIG. 6, corresponds to the reset operation of floating diffusion region FD and second charge storage C2 in the first iteration of the repetition operations. In this reset operation, first transfer transistor 2, second reset transistor 8, and second transfer transistor 3 are off, and first reset transistor 4 and accumulating transistor 7 are both on. In other words, compared to (a) in FIG. 7, in (b) in FIG. 7, first reset transistor 4 and accumulating transistor 7 are changed from off to on. This resets floating diffusion region FD and second charge storage C2 to reset voltage RD0.

Time t1a in (c) in FIG. 7, i.e., the beginning of period T1 in FIG. 6, corresponds to the state immediately after the reset of floating diffusion region FD and second charge storage C2 in the first iteration of the repetition operations. In this state, first transfer transistor 2, second reset transistor 8, second transfer transistor 3, and accumulating transistor 7 are off. First reset transistor 4 is not off but half-on. First reset transistor 4 is maintained in the half-on state from period T2 to period T4 thereafter. This causes first reset transistor 4 to perform charge sliding operation P3. In other words, charge exceeding a predetermined amount in floating diffusion region FD is discharged to the power supply line of reset voltage RD0 via first reset transistor 4. Stated differently, the charge stored in floating diffusion region FD is inhibited so that it does not exceed a predetermined amount.

Time t1b in (d) in FIG. 7, i.e., the middle part of period T1 in FIG. 6, corresponds to an operation to reset first charge storage C1 in the first iteration of the repetition operations. In this reset operation, first transfer transistor 2, second transfer transistor 3, and accumulating transistor 7 are off, second reset transistor 8 is on, and first reset transistor 4 is half-on. In other words, compared to (c) in FIG. 7, in (d) in FIG. 7, second reset transistor 8 changes from off to on. As a result, the charge in first charge storage C1 is discharged to the power supply line of reset voltage RD1 via second reset transistor 8. In this example, reset voltage RD1 is Vr. First charge storage C1 is reset to potential Vr. During this reset operation, since first transfer transistor 2 is off, no path for the through-current of photodiode APD is formed. The reset operation of first charge storage C1 in (d) in FIG. 7 is faster and more accurate than in (l) in FIG. 4 because first charge storage C1 can be reset directly without the intervention of second transfer transistor 3 when setting first charge storage C1 to the reset potential.

Time t2a in (e) in FIG. 7, i.e., the beginning of period T2 in FIG. 6, corresponds to the state immediately after the reset operation of first charge storage C1 in the first iteration of the repetition operations. In this state, first transfer transistor 2, second reset transistor 8, second transfer transistor 3, and accumulating transistor 7 are off, and first reset transistor 4 is half-on. First charge storage C1 is in the reset state of reset voltage RD1.

Time t2b in (f) in FIG. 7, i.e., the middle part of period T2 in FIG. 6, corresponds to the transfer of charge from photodiode APD to first charge storage C1 in the first iteration of the repetition operations. In this charge transfer, first transfer transistor 2 is on, second reset transistor 8, second transfer transistor 3, and accumulating transistor 7 are off, and first reset transistor 4 is half-on. In other words, compared to (e) in FIG. 7, in (f) in FIG. 7, first transfer transistor 2 changes from off to on. As a result of first transfer transistor 2 being on, the potential barrier between photodiode APD and first charge storage C1 is eliminated and the charge from photodiode APD is transferred to first charge storage C1, bringing them to the same potential.

Put more specifically, in this operation example, since light is constantly incident on photodiode APD, photodiode APD receives incident light and generates a large amount of charge due to avalanche multiplication. Avalanche multiplication stops when photodiode APD reaches the Vq potential at which it is quenched. As a result, photodiode APD and first charge storage C1 are filled with charge up to the Vq potential, as illustrated in (f) in FIG. 7.

Here, in the period when first transfer transistor 2 is on, since second transfer transistor 3 is off and second reset transistor 8 is also off, no current path is formed in photodiode APD where a through-current can occur. Through-current caused by avalanche multiplication can therefore be inhibited and the operation of photodiode APD can be stabilized.

Time t3a in (g) in FIG. 7, i.e., the beginning of period T3 in FIG. 6, corresponds to the state immediately after the transfer of charge from photodiode APD to first charge storage C1 in the first iteration of the repetition operations. In this state, first transfer transistor 2, second reset transistor 8, second transfer transistor 3, and accumulating transistor 7 are off, and first reset transistor 4 is half-on. A charge up to the Vq potential is stored in photodiode APD. A charge is also stored up to the Vq potential in first charge storage C1.

Time t3b in (h) in FIG. 7, i.e., the middle part of period T3 in FIG. 6, corresponds to the transfer of charge from first charge storage C1 to floating diffusion region FD in the first iteration of the repetition operations. In this charge transfer, first transfer transistor 2, second reset transistor 8, and accumulating transistor 7 are off, and second transfer transistor 3 and first reset transistor 4 are half-on. In other words, compared to (g) in FIG. 7, in (h) in FIG. 7, second transfer transistor 3 changes from off to half-on. Since second transfer transistor 3 is half-on, the portion of the charge that was stored in first charge storage C1 in (g) in FIG. 7 that exceeds a certain amount is transferred to floating diffusion region FD. The potential barrier caused by the half-on state of second transfer transistor 3 is set slightly higher than the potential barrier caused by the half-on state of first reset transistor 4. Moreover, since first reset transistor 4 is also half-on, the portion of the charge transferred from first charge storage C1 that exceeds a predetermined amount is discharged to the power supply line of reset voltage RD0 as a result of the sliding operation. In other words, the charge stored in floating diffusion region FD is inhibited so that it does not exceed a predetermined amount.

Time t4a in (i) in FIG. 7, i.e., the beginning of period T4 in FIG. 6, corresponds to the state immediately after the transfer of charge from first charge storage C1 to floating diffusion region FD in the first iteration of the repetition operations. In this state, first transfer transistor 2, second reset transistor 8, second transfer transistor 3, and accumulating transistor 7 are off, and first reset transistor 4 is half-on. In other words, compared to (h) in FIG. 7, in (i) in FIG. 7, second transfer transistor 3 changes from half-on to off. In this state, floating diffusion region FD stores the charge transferred from first charge storage C1. A charge not exceeding a certain amount is stored in first charge storage C1 as well.

Time t4b in (j) in FIG. 7, i.e., the middle part of period T4 in FIG. 6, corresponds to the transfer of charge from floating diffusion region FD to second charge storage C2 in the first iteration of the repetition operations. In this charge transfer, first transfer transistor 2, second reset transistor 8, and second transfer transistor 3 are off, first reset transistor 4 is half-on, and accumulating transistor 7 is on. In other words, compared to (i) in FIG. 7, in (j) in FIG. 7, accumulating transistor 7 changes from off to on. As a result, floating diffusion region FD and second charge storage C2 have the same potential, and the charge is capacitively distributed. Part of the charge stored in floating diffusion region FD is transferred to second charge storage C2. In other words, part of the charge stored in floating diffusion region FD is transferred to second charge storage C2.

Time t5a in (k) in FIG. 7, i.e., the beginning of period T5 in FIG. 6, corresponds to the state immediately after the transfer of charge from floating diffusion region FD to second charge storage C2 in the first iteration of the repetition operations. In this state, first transfer transistor 2, second reset transistor 8, second transfer transistor 3, and accumulating transistor 7 are off, and first reset transistor 4 is half-on. In other words, compared to (j) in FIG. 7, in (k) in FIG. 7, accumulating transistor 7 changes from on to off. In this state, second charge storage C2 stores the charge transferred from floating diffusion region FD.

In FIG. 7, (a) to (k) illustrate the first iteration of N repetition operations in global operation P1.

The same operation as the first iteration is repeated thereafter. Repeating operation from periods T1 to T4 N times accumulates the pixel signals from N exposures in second charge storage C2. This improves the signal-to-noise ratio and accuracy of pixel signals.

After global operation P1, which includes N repetitions of periods T1 to T4, rolling operation P2 is performed to read out pixel signals row by row.

Period T5 in FIG. 6 is the transition period from global operation P1 to rolling operation P2. Rolling operation P2 includes periods T6 through T11.

In period T6, floating diffusion region FD is reset. However, the reset of floating diffusion region FD may be omitted in period T6.

In period T7, charge is accumulated in second charge storage C2 and transferred to FD.

In period T8, the charge in floating diffusion region FD is converted to voltage by amplification transistor 5. The converted voltage is output to vertical signal line 9 as a signal level among pixel signals.

In period T9, floating diffusion region FD and second charge storage C2 are reset to reset voltage RD0.

In period T10, the charge in the reset floating diffusion region FD is converted to voltage by amplification transistor 5. The converted voltage is output to vertical signal line 9 as a reset level among pixel signals.

Period T11 is the transition period to the next frame period.

As explained above, the solid-state imaging apparatus according to Embodiment 2 further includes second reset transistor 8 that resets first charge storage C1.

With this, since the through-current is inhibited during reset and first charge storage C1 is directly reset, the noise level of the reset level is reduced, which improves the signal-to-noise ratio and the accuracy of the pixel signal.

The solid-state imaging apparatus may further include control circuit 30 that resets first charge storage C1 by turning off first transfer transistor 2, second transfer transistor 3, and accumulating transistor 7, turning on second reset transistor 8, and turning half-on first reset transistor 4.

This allows direct resetting of first charge storage C1 and also inhibits through-current during resetting.

The solid-state imaging apparatus may further include control circuit 30 that: turns off second reset transistor 8, first transfer transistor 2, and second transfer transistor 3 and turns on first reset transistor 4 and accumulating transistor 7 in first period T0 for resetting floating diffusion region FD and second charge storage C2; and turns off first transfer transistor 2, second transfer transistor 3, and accumulating transistor 7, turns on second reset transistor 8, and turns half-on first reset transistor 4 in second period T1 for resetting first charge storage C1.

This makes it possible to inhibit through-current of the photodiode and stabilize its operation since formation of a through-current path is difficult, even when first reset transistor 4 is half-on.

In one frame period, control circuit 30 may control global operation P1 and rolling operation P2. Global operation P1 simultaneously exposes all of the plurality of pixel circuits. Rolling operation P2 reads out signals row by row from the plurality of pixel circuits. Global operation P1 may include the first period and the second period. Control circuit 30 may maintain first reset transistor 4 in a half-on state in the second period and subsequent periods among periods of global operation P1.

With this, even if a charge is suddenly generated by avalanche multiplication in global operation P1, the excess charge can be properly controlled because first reset transistor 4 discharges a charge exceeding a certain amount in floating diffusion region FD.

Embodiment 3

Embodiment 3 describes a configuration example of a ranging apparatus presented as an example of application of the solid-state imaging apparatus according to Embodiment 1 and Embodiment 2.

[3.1 Ranging Apparatus Configuration]

Figure 8:
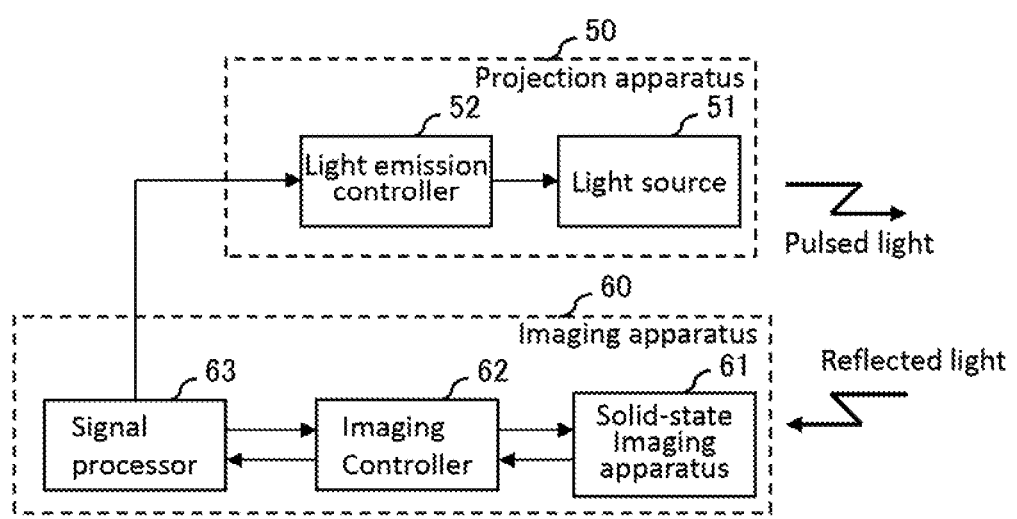
FIG. 8 is a block diagram illustrating a configuration example of a ranging apparatus according to Embodiment 3.

FIG. 8 is a block diagram of an example of the ranging apparatus according to Embodiment 3.

This ranging apparatus includes projection apparatus 50 and imaging apparatus 60. Projection apparatus 50 projects light toward a target region. Accordingly, projection apparatus 50 includes light source 51 and light emission controller 52.

Imaging apparatus 60 receives reflected light, which is light emitted from projection apparatus 50 and reflected by an object in the target region. Accordingly, imaging apparatus 60 includes solid-state imaging apparatus 61, imaging controller 62, and signal processor 63.

Light source 51 includes a laser light source or light emitting diode (LED) or the like, and emits light at a predetermined wavelength.

Light emission controller 52 causes light source 51 to emit pulsed light under control from signal processor 63.

Solid-state imaging apparatus 61 is the solid-state imaging apparatus according to Embodiment 1 or 2, and receives the reflected light from the object that received the light emitted from projection apparatus 50.

Imaging controller 62 drives solid-state imaging apparatus 61 under control from signal processor 63.

Signal processor 63 calculates the distance to the object by controlling light emission controller 52 and imaging controller 62. Stated differently, signal processor 63 pulses light source 51 via light emission controller 52. The reflected light based on this pulsed emission of light is received by solid-state imaging apparatus 61. Then, based on the time difference between the timing of the pulsed emission of light and the timing of the reception of the reflected light at each pixel circuit 1, signal processor 63 measures the distance, to the object at the position in the target region, corresponding to each pixel circuit 1.

When solid-state imaging apparatus 61 includes pixel circuit 1 according to Embodiment 1, the surface area of pixel array 10 on the semiconductor substrate is smaller than when it includes pixel circuit 1 according Embodiment 2. Stated differently, the surface area can be reduced because pixel circuit 1 does not include second reset transistor 8.

Moreover, when solid-state imaging apparatus 61 includes pixel circuit 1 according to Embodiment 2, the signal-to-noise ratio and the accuracy of the pixel signals can be improved and the speed can be further increased compared to when it includes pixel circuit 1 according to Embodiment 1. This is because the reset state of first charge storage C1 is not a reset state in which a certain amount of charge is stored in first charge storage C1, but is directly reset to reset voltage RD1, which is less susceptible to noise.

The ranging apparatus in FIG. 8 may generate luminance images as well as distance images. Control circuit 30 in FIG. 2 may be provided on the same semiconductor substrate as the solid-state imaging apparatus, and, alternatively, may be provided on a different semiconductor substrate than the solid-state imaging apparatus.

In each of the above embodiments, all or some of the elements may be realized either by dedicated hardware or by executing a software program suitable for each element. Some of the elements may be realized by a program execution unit, such as a CPU or processor, reading and executing a software program recorded on a recording medium such as semiconductor memory.

Although the solid-state imaging apparatus and the ranging apparatus according to one or more aspects have been described based on embodiments, the present invention is not limited to these embodiments. Various modifications of the embodiments as well as embodiments resulting from arbitrary combinations of elements of different embodiments that may be conceived by those skilled in the art may be included within the scope of the one or more aspects as long as they do not depart from the essence of the present invention.

INDUSTRIAL APPLICABILITY

The solid-state imaging apparatus and the ranging apparatus according to the present disclosure are applicable in a camera, for example.

The invention claimed is:

1. A solid-state imaging apparatus comprising:
a plurality of pixel circuits arranged in a matrix, wherein each of the plurality of pixel circuits includes:
  a photodiode that generates a charge;
  a first charge storage;
  a floating diffusion region;
  a second charge storage;
  a first transfer transistor that transfers the charge from the photodiode to the first charge storage;
  a second transfer transistor that transfers the charge from the first charge storage to the floating diffusion region;
  a first reset transistor that resets the floating diffusion region; and
  an accumulating transistor for accumulating the charge of the floating diffusion region in the second charge storage; and
a control circuit that resets the first charge storage by turning off the first transfer transistor and the accumulating transistor and turning half-on the first reset transistor and the second transfer transistor.

2. The solid-state imaging apparatus according to claim 1, wherein:
the control circuit
turns off the first transfer transistor and turns on the first reset transistor, the second transfer transistor, and the accumulating transistor in a first period for resetting the floating diffusion region and the second charge storage; and
turns off the first transfer transistor and the accumulating transistor and turns half-on the first reset transistor and the second transfer transistor in a second period for resetting the first charge storage.

3. The solid-state imaging apparatus according to claim 2, wherein;

in one frame period, the control circuit controls a global operation and a rolling operation, the global operation including simultaneously exposing the plurality of pixel circuits, the rolling operation including reading out signals row by row from the plurality of pixel circuits,
the first period and the second period are included in the global operation, and
the control circuit maintains the first reset transistor in a half-on state in the second period and subsequent periods of the global operation.

4. The solid-state imaging apparatus according to claim 3, wherein the control circuit:
controls transfer of charge from the photodiode to the first charge storage in a third period;
controls transfer of charge from the first charge storage to the floating diffusion region in a fourth period;
controls storage of charge from the floating diffusion region to the second charge storage in a fifth period; and
maintains the first reset transistor in a half-on state from the second period to the fifth period.

5. The solid-state imaging apparatus according to claim 4, wherein in the fourth period, the control circuit turns off the first transfer transistor and the accumulating transistor and turns half-on the second transfer transistor.

6. The solid-state imaging apparatus according to claim 5, wherein in the fourth period, a height of a potential barrier formed at a gate of the second transfer transistor is greater than a height of a potential barrier formed at a gate of the first reset transistor.

7. The solid-state imaging apparatus according to claim 4, wherein in one frame period, the control circuit repeats the second period through the fifth period a plurality of times after the first period.

8. A ranging apparatus comprising:
a light projection apparatus; and
the solid-state imaging apparatus according to claim 1.

9. The solid-state imaging apparatus according to claim 1, wherein:
a capacitance of the first charge storage is greater than a capacitance of the floating diffusion region, and
a capacitance of the second charge storage is greater than the capacitance of the floating diffusion region.

10. A solid-state imaging apparatus comprising:
a plurality of pixel circuits arranged in a matrix, wherein each of the plurality of pixel circuits includes:
  a photodiode that generates a charge;
  a first charge storage;
  a floating diffusion region;
  a second charge storage;
  a first transfer transistor that transfers the charge from the photodiode to the first charge storage;
  a second transfer transistor that transfers the charge from the first charge storage to the floating diffusion region;
  a first reset transistor that resets the floating diffusion region;
  an accumulating transistor for accumulating the charge of the floating diffusion region in the second charge storage; and
  a second reset transistor that resets the first charge storage; and
a control circuit that turns half-on the second transfer transistor.

11. The solid-state imaging apparatus according to claim 10, wherein the control circuit turns half-on the first reset transistor.

12. The solid-state imaging apparatus according to claim 10, wherein the control circuit resets the first charge storage by turning off the first transfer transistor, the second transfer transistor, and the accumulating transistor, turning on the second reset transistor, and turning half-on the first reset transistor.

13. The solid-state imaging apparatus according to claim 10, wherein the control circuit
turns off the second reset transistor, the first transfer transistor, and the second transfer transistor and turns on the first reset transistor and the accumulating transistor in a first period for resetting the floating diffusion region and the second charge storage; and
turns off the first transfer transistor, the second transfer transistor, and the accumulating transistor, turns on the second reset transistor, and turns half-on the first reset transistor in a second period for resetting the first charge storage.

14. The solid-state imaging apparatus according to claim 13, wherein:
in one frame period, the control circuit controls a global operation and a rolling operation, the global operation simultaneously exposing all of the plurality of pixel circuits, the rolling operation reading out signals row by row from the plurality of pixel circuits,
the global operation includes the first period and the second period, and
the control circuit maintains the first reset transistor in a half-on state in the second period and subsequent periods among periods of the global operation.

15. The solid-state imaging apparatus according to claim 14, wherein the control circuit:
controls transfer of the charge from the photodiode to the first charge storage in a third period;
controls transfer of the charge from the first charge storage to the floating diffusion region in a fourth period;
controls storage of the charge from the floating diffusion region to the second charge storage in a fifth period; and
maintains the first reset transistor in a half-on state from the second period to the fifth period.

16. The solid-state imaging apparatus according to claim 15, wherein in the fourth period, the control circuit turns off the first transfer transistor and the accumulating transistor and turns half-on the second transfer transistor.

17. The solid-state imaging apparatus according to claim 16, wherein in the fourth period, a height of a potential barrier formed at a gate of the second transfer transistor is greater than a height of a potential barrier formed at a gate of the first reset transistor.

18. The solid-state imaging apparatus according to claim 15, wherein in one frame period, the control circuit repeats the second period through the fifth period a plurality of times after the first period.

19. A ranging apparatus comprising:
a light projection apparatus; and
the solid-state imaging apparatus according to claim 10.

20. The solid-state imaging apparatus according to claim 10, wherein:
a capacitance of the first charge storage is greater than a capacitance of the floating diffusion region, and
a capacitance of the second charge storage is greater than the capacitance of the floating diffusion region.

* * * * *